US007799990B2

(12) United States Patent
Marks et al.

(10) Patent No.: US 7,799,990 B2
(45) Date of Patent: *Sep. 21, 2010

(54) ELECTRON-BLOCKING LAYER / HOLE-TRANSPORT LAYER FOR ORGANIC PHOTOVOLTAICS AND APPLICATIONS OF SAME

(75) Inventors: Tobin J. Marks, Evanston, IL (US); Alexander W. Hains, Evanston, IL (US); Michael D. Irwin, Chicago, IL (US); He Yan, Skokie, IL (US)

(73) Assignee: Northwestern University, Evanston, IL (US)

( * ) Notice: Subject to any disclaimer, the term of this patent is extended or adjusted under 35 U.S.C. 154(b) by 7 days.

This patent is subject to a terminal disclaimer.

(21) Appl. No.: 12/046,929

(22) Filed: Mar. 12, 2008

(65) Prior Publication Data

US 2008/0223445 A1 Sep. 18, 2008

Related U.S. Application Data

(60) Provisional application No. 60/906,456, filed on Mar. 12, 2007.

(51) Int. Cl.
*H01L 31/00* (2006.01)
(52) U.S. Cl. .................................... 136/263
(58) Field of Classification Search ............... 136/263, 136/252
See application file for complete search history.

(56) References Cited

U.S. PATENT DOCUMENTS

2005/0061363 A1* 3/2005 Ginley et al. ............... 136/252

2005/0147846 A1* 7/2005 Marks et al. ............... 428/690

OTHER PUBLICATIONS

Park et al. "Improvement of device performances by thin interlayer in conjugated polymers/methanofullerene plastic solar cell." Solar Energy Materials and Solar Cells 91 (2007) 751-753.*
Kim et al. "Spin-cast thin semiconducting polymer interlayer for improving device efficiency of polymer light-emitting diodes." Applied Physics Letters 87 (2005) 023506.*
Sun et al. "Organic photovoltaics: mechanism, materials, and devices" Taylor and Francis Group, Boca Raton, FL, 2005, p. 551.*
Al-Ibrahim et al. "Comparison of normal and inverse poly(3-hexylthiophene)/fullerene solar cell architectures" Solar Energy Materials and Solar Cells 85 (2005) 277-283.*

* cited by examiner

*Primary Examiner*—Jeffrey T Barton
*Assistant Examiner*—Allison Bourke
(74) *Attorney, Agent, or Firm*—Tim Tingkang Xia; Morris, Manning & Martin LLP

(57) ABSTRACT

The present invention, in one aspect, relates to a solar cell. In one embodiment, the solar cell includes an anode; an active organic layer comprising an electron-donating organic material and an electron-accepting organic material; a semiconducting layer formed between the anode and the active organic layer; and an electron-blocking layer (EBL) formed between the semiconducting layer and the active organic layer, where the EBL is transparent and adapted for blocking electron leakage from the active organic layer to the anode while transporting holes from the active organic layer to the anode.

24 Claims, 6 Drawing Sheets

TFB

TPDSi₂

ELECTRON-BLOCKING LAYER / HOLE-TRANSPORT LAYER FOR ORGANIC PHOTOVOLTAICS AND APPLICATIONS OF SAME

CROSS-REFERENCE TO RELATED PATENT APPLICATION

This application claims the benefit, pursuant to 35 U.S.C. §19(e), of U.S. provisional patent application Ser. No. 60/906,456, filed Mar. 12, 2007, entitled "ELECTRON-BLOCKING LAYER/HOLE-TRANSPORT LAYER FOR ORGANIC PHOTOVOLTAICS AND APPLICATIONS OF SAME," by Tobin J. Marks, Alexander W. Hains, Michael D. Irwin, and He Yan, which is incorporated herein by reference in its entirety.

Some references, which may include patents, patent applications and various publications, are cited in a reference list and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, "[n]" represents the nth reference cited in the reference list. For example, [15] represents the 15th reference cited in the reference list, namely, Yan, H.; Marks, T. J. *Proc. SPIE-Int. Soc. Opt. Eng.* 2004, 5519, 270.

FIELD OF THE INVENTION

The present invention relates generally to a photovoltaic device, and more particularly to a bulk-heterojunction solar cell that utilizes an interfacial electron-blocking/hole-transporting layer to enhance the solar cell performance, which can be used in a photovoltaic device.

BACKGROUND OF THE INVENTION

Organic photovoltaic (OPV) cells offer several advantages over the traditional inorganic photovoltaic cells. OPV cells can be made with flexible substrates, they are lightweight, and amenable to production by inexpensive techniques such as spin-coating, doctor blading, and printing [1]. OPV cells could even be incorporated into clothing. The unique set of advantages makes organic solar cells (OSCs) desirable in several areas where the heavier, inflexible inorganic cells are difficult to work with. For example, military gears could use OPV cells to reduce the weight of batteries carried by soldiers in the field; tents with OPV cells on the roof could become portable headquarters with a lightweight power supply built into the roofs; and countless portable electronic devices like cell phones, PDAs and MP3 players could regenerate some of their battery while in use outdoors, prolonging use between charges. However, the only holdup is that the power conversion efficiency ($\eta_p$) of OPV cells is currently too low for them to be used commercially. It is estimated that if an organic solar cell could reach $\eta_p=10\%$, which seems possible [6], it will likely become commercially viable [1].

Approaches exist for increasing the power conversion efficiency of OPV cells. Several breakthroughs have yielded the power conversion efficiencies of OPV cells relatively close to what they need to be to find a niche in the market [2-5]. It is demonstrated that bulk-heterojunction (BHJ) solar cell design may improve the power conversion efficiency. In a BHJ solar cell, a donor polymer such as poly(2-methoxy-5-(3',7'-dimethyl-octyloxy))-p-phenylene vinylene (MDMO-PPV) or poly(3-hexylthiophene) (P3HT) and an acceptor material such as [6,6]-phenyl-$C_{61}$ butyric acid methyl ester (PCBM) are combined in solution and together spin-coated to form a phase-separated blend on the transparent conductive anode, usually tin-doped indium oxide (ITO) anode. Fabrication is completed by depositing a metal such as aluminum as the cell cathode. Currently, BHJ solar cells have achieved the power conversion efficiency $\eta_p$ around 2.5% to 5% [7, 8, 14].

The power conversion efficiency $\eta_p$ of a solar cell is defined as follows:

$$\eta_p = \frac{V_{oc} J_{sc} FF}{P_o} \qquad (1)$$

where $V_{oc}$ is the open-circuit voltage, $J_{sc}$ is the short-circuit current, FF is the fill factor, and $P_o$ is the incident light intensity on the cell during testing in units of watts per area. The definition of the power conversion efficiency shows that increasing the open-circuit voltage ($V_{oc}$), the short-circuit current ($J_{sc}$) and the fill factor (FF) will all lead to enhance the power conversion efficiency.

The origin of the open-circuit voltage has been debated in the literature [9-13]. However, it is generally thought that the open-circuit voltage $V_{oc}$ originates from the energetic difference between the highest occupied molecular orbital (HOMO) of the donor material and the lowest unoccupied molecular orbital (LUMO) of the acceptor material of the BHJ solar cells. This difference is the theoretical maximum of the open-circuit voltage $V_{oc}$. However, in practice, the open-circuit voltages $V_{oc}$ achieved are 300 mV or more less than the maximum value. This loss in the photovoltage is broken down by Scharber et al. [6] into a 100 mV loss attributed to the fact that the photocurrent in the BHJ solar cells is mainly field-driven and a 200 mV loss caused by dark current. If some significant part of this 300 mV loss in the open-circuit voltage $V_{oc}$ could be recovered, the overall $\eta_p$ of the solar cell would increase significantly.

In a BHJ solar cell, both the donor polymer and the acceptor molecule are touching both electrodes, interfacial effects probably limit realization of the maximum theoretical open-circuit voltage $V_{oc}$. For example, electrons in the PCBM may be formed at an interface very close to the ITO anode, which typically collects the holes. There may, however, be some small flow of electrons from the PCBM near the ITO anode/organic interface to the ITO anode. Although this leakage current flows against the built-in electric field in the BHJ solar cell, it is energetically favorable for an electron in the HOMO level of PCBM (about 4.1 eV) to transfer to the ITO anode (workfunction≈4.7 eV). Any electrons transferred to the ITO anode would essentially recombine with holes and reduce the working voltage of the BHJ solar cell. In this way, the open-circuit voltage $V_{oc}$, or the voltage that is required to counter any photovoltage created by the solar cell and reduce the photocurrent to zero, would also be reduced. A similar effect should take place at the cathode if holes are produced in the HOMO of the polymer very near the Al cathode.

Therefore, a heretofore unaddressed need exists in the art to address the aforementioned deficiencies and inadequacies.

SUMMARY OF THE INVENTION

One of the objectives of the current invention is to improve the open-circuit voltage $V_{oc}$ of BHJ solar cells.

In one aspect, the present invention relates to a solar cell. In one embodiment, the solar cell has a transparent substrate; a tin-doped indium oxide (ITO anode) anode formed on the transparent substrate; a semiconducting layer formed of poly (3,4-ethylenedioxythiophene) (PEDOT) and poly(styrene-sulfonate) (PSS) on the ITO anode; an electron-blocking layer (EBL) formed of a polymer poly(9,9-dioctylfluorene-co-N-(4-(3-methylpropyl))diphenylamine) (TFB) and a small molecule 4,4'-bis[(p-trichlorosilylpropylphenyl)phenylamino]biphenyl (TPDSi$_2$) on the semiconducting layer; an active organic layer formed of MDMO-PPV and PCBM on the EBL; a lithium fluoride (LiF) layer formed on the active organic layer; and a metallic aluminum (Al) cathode formed on the LiF layer.

In one embodiment, the EBL has a thickness of about 1-80 nm, preferably, about 2-30 nm. The ratio of TPDSi$_2$ to TFB in the EBL is about 1:1 in weight.

In another aspect, the present invention relates to an organic photovoltaic device comprising one or more solar cells as disclosed above.

In yet another aspect, the present invention relates to a solar cell. In one embodiment, the solar cell has an anode; an active organic layer comprising an electron-donating organic material and an electron-accepting organic material; a semiconducting layer formed between the anode and the active organic layer; and an electron-blocking layer (EBL) formed between the semiconducting layer and the active organic layer, wherein the EBL is transparent and adapted for blocking electron leakage from the active organic layer to the anode while transporting holes from the active organic layer to the anode. The solar cell further has a LiF layer formed on the active organic layer; and a cathode formed on the LiF layer.

In one embodiment, the cathode is formed of a metal, where the metal comprises Al, titanium (Ti), tungsten (W), silver (Ag), or gold (Au), an alloy thereof, or the like. The anode is transparent and formed of tin-doped indium oxide (ITO anode).

The semiconducting layer comprises PEDOT and PSS.

The EBL comprises a hole-transport polymer characterized with a hole-mobility higher than that of the electron-donating organic material in the active layer, and a small molecule that has a high hole-mobility and is capable of crosslinking on contact with air. In one embodiment, the hole-transport polymer comprises TFB, and the small molecule comprises TPDSi$_2$. The ratio of TPDSi$_2$ to TFB in the EBL is about 1:1 in weight. The EBL has a thickness of about 1-80 nm, preferably, about 2-30 nm.

In one embodiment, the electron-donating organic material comprises P3HT, MDMO-PPV, poly(2,7-(9-(2'-ethylhexyl)-9-hexyl-fluorene)-alt-5,5-(4',7'-di-2-thienyl-2',1',3'-benzothiadiazole)) (PFDTBT), poly(2,6-(4,4-bis-(2-ethylhexyl)-4H-cyclopenta(2,1-b;3,4-6')dithiophene)-alt-4,7-(2,1,3-benzothiadiazole)) (PCPDTBT), or poly(p-phenylene-ethynylene)-alt-poly(p-phenylene-vinylene) (PPE-PPV), and the electron-accepting organic material comprises PCBM or another C60/C70 based derivative.

In a further aspect, the present invention relates to an organic photovoltaic device comprising a plurality of solar cells as disclosed above. The plurality of solar cells in one embodiment are configured to be in a stack. An organic photovoltaic device may also be formed with one such solar cell.

In a further aspect, the present invention relates to a method of fabricating a solar cell. In one embodiment, the method includes the steps of (a) preparing a first solution containing PEDOT and PSS; (b) preparing a second solution containing TFB and TPDSi$_2$; (c) preparing a third solution containing MDMO-PPV and PCBM; (d) providing a substrate having an ITO anode coated layer; (e) patterning the ITO anode coated layer into at least two spatially separated strips to form an anode; (f) spin-coating the first solution onto the patterned ITO anode-coated substrate to form a PEDOT:PSS layer thereon; (g) spin-coating the second solution onto the PEDOT:PSS layer to form a TPDSi$_2$:TFB layer thereon; (h) spin-coating the third solution onto the TPDSi$_2$:TFB layer to form an active organic layer; (i) vapor-depositing LiF onto the active organic layer to form a LiF layer thereon; and (j) forming a metallic cathode on the LiF layer.

In one embodiment, the step of preparing the third solution comprises the steps of mixing the amount of MDMO-PPV and the amount of PCBM in chlorobenzene to form a mixture; and stirring the mixture for about 12-18 hours at a temperature about 50° C. in a dark environment with nitrogen to form the third solution.

In one embodiment, each of spin-coating steps (f)-(h) further comprises the step of annealing the corresponding spin-coated layer. Spin-coating steps (g) and (h) are performed in a nitrogen-filled glove box.

The step of forming a metallic cathode on the LiF layer comprises a step of forming an Al cathode on the LiF layer.

In yet a further aspect, the present invention relates to a method of fabricating a solar cell. In one embodiment, the method includes a method of fabricating a solar cell, comprising the steps of: forming an anode on a transparent substrate; forming a semiconducting layer formed on the anode; forming an EBL on the semiconducting layer; and forming an active organic layer formed on the EBL, wherein the active organic layer comprises an electron-donating organic material and an electron-accepting organic material, where the EBL is formed such that it is transparent and adapted for blocking electron leakage from the active organic layer to the anode while transporting holes from the active organic layer to the anode.

The method further includes the steps of forming a LiF layer on the active organic layer; and forming a cathode on the LiF layer.

In one embodiment, the anode is transparent and formed of ITO anode. The semiconducting layer comprises PEDOT and PSS. The EBL comprises a hole-transport polymer characterized with a hole-mobility higher than that of the electron-donating organic material in the active layer, and a small molecule that has a high hole-mobility and is capable of crosslinking on contact with air. The hole-transport polymer comprises TFB, and the small molecule comprises TPDSi$_2$, where the ratio of TPDSi$_2$ to TFB in the EBL is about 1:1 in weight.

The electron-donating organic material comprises P3HT, MDMO-PPV, PFDTBT, PCPDTBT, or PPE-PPV, and the electron-accepting organic material comprises PCBM.

In one aspect, the present invention relates to a method for forming a solar cell device with a plurality of solar cells in a stack, where each of the plurality of solar cells is formed by the method above.

These and other aspects of the present invention will become apparent from the following description of the preferred embodiment taken in conjunction with the following drawings, although variations and modifications therein may be affected without departing from the spirit and scope of the novel concepts of the disclosure.

DETAILED DESCRIPTION OF THE INVENTION

Figure 1:
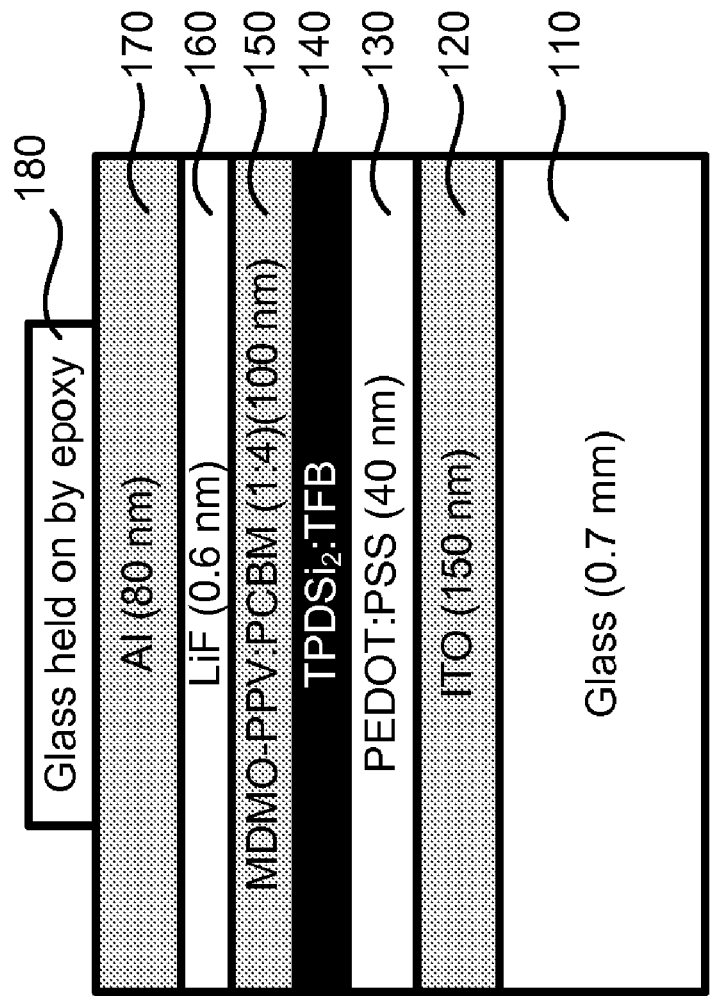
FIG. 1 shows schematically an OPV cell having an EBL according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention. Additionally, some terms used in this specification are more specifically defined below.

Definitions

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

Unless otherwise defined, all technical and scientific terms used herein have the same meaning as commonly understood by one of ordinary skill in the art to which this invention pertains. In the case of conflict, the present document, including definitions will control.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "open-circuit voltage" refers to the difference of electrical potential between two terminals of a device when there is no external load connected, i.e., the circuit is broken or open. Under these conditions there is no external electric current flow between the terminals, although there may be current flow internally (e.g., self-discharge currents in batteries). As known to those skilled in the art, the open-circuit voltage of solar cells are often quoted under particular conditions (state-of-charge, illumination, temperature, etc.). Usually, the energetic difference between the HOMO of the donor material and the LUMO of the acceptor material in a solar cell less the exciton binding energy defines the theoretical maximum open-circuit voltage, V$_{oc}$.

The term "fill factor" or its acronym "FF", as used herein, refers to the ratio of the maximum power (V$_{mp}$×J$_{mp}$) divided by the short-circuit current density (J$_{sc}$) and open-circuit voltage (V$_{oc}$) in light current density-voltage (J-V) characteristics of solar cells. The open circuit voltage (V$_{oc}$) is the maximum voltage obtainable at the load under open-circuit conditions. The short circuit current density (J$_{sc}$) is the maximum current through the load under short-circuit conditions.

Overview of the Invention

The description will be made as to the embodiments of the present invention in conjunction with the accompanying drawings of FIGS. 1-5. In accordance with the purposes of this invention, as embodied and broadly described herein, this invention, in one aspect, relates to a BHJ solar cell that utilizes an interfacial EBL formed between the anode and the active layer for enhancing the open-circuit voltage, thereby, improving the cell power conversion efficiency.

The thin, covalently-bound interfacial EBL is adapted to maximize hole transport from the active layer to the anode and to minimize charge recombination losses at the anode. Therefore, the interfacial layer functions as both an EBL and a hole-transport layer (HTL). In one embodiment, the interfacial layer includes two components. The first component is a hole-transport polymer with a higher hole-mobility than the donor polymer in the active layer. As a polymer it adds viscosity so that the EBL can easily be spin-coated from solution. The second component is a small molecule that has a high hole-mobility and also crosslinks on contact with air. As the molecule crosslinks, it forms an insoluble layer that is not washed away when another layer is spin-coated on top of it. This allows the active layer to be spin-coated from chlorobenzene on top of the EBL without dissolution of the EBL.

In one embodiment, the first component includes a hole-transporting polymer of TFB and the second component includes a small molecule of TPDSi$_2$. The interfacial EBL is formed of the TPDSi$_2$:TFB blend that is compatible with BHJ solar cell designs, transports holes while blocking misdirected electrons, and crosslinks in air to form a robust matrix which covalently bonds to the ITO anode. These properties afford excellent cell thermal durability versus solar cells with a PEDOT:PSS interfacial layer, or with no interfacial layer. Moreover, the performance metrics of the TPDSi$_2$:TFB-modified solar cells are significantly higher than solar cells fabricated with a PEDOT:PSS interfacial layer, or with no interfacial layer.

Referring to FIG. 1, a BHJ solar cell 100 is shown according to one embodiment of the present invention. The BHJ solar cell 100 has an anode 120, an active organic layer 150 having an electron-donating organic material and an electron-accepting organic material, a semiconducting layer 130 formed between the anode 120 and the active organic layer 150, and an EBL 140 formed between the semiconducting layer 130 and the active organic layer 150, where the EBL is transparent and adapted for blocking electron leakage from the active organic layer to the anode while transporting holes from the active organic layer 150 to the anode 120. The solar cell further has a LiF layer 160 formed on the active organic layer 150; and a cathode 170 formed on the LiF layer 160.

In this exemplary embodiment shown in FIG. 1, the anode 120 is formed of a transparent ITO, and has a thickness of about 150 nm. The LiF layer 160 is very thin, compared to the other layers of the solar cell 100, about 0.6 nm. The metallic cathode 170 can be an Al, Ti, W, Ag, or Au cathode, or the like. The cathode layer 170 is formed to have a thickness of about 80 nm in this embodiment. The role of a very thin LiF layer 160 is to either protect the organic materials during cathode deposition, modify the work function of the electrode 170, or form a dipole moment across the junction and leads to increased charge transfer to the electrode 170 [12].

The semiconducting layer 130 is formed of PEDOT and PSS blend with a thickness of about 40 nm and a ratio of PEDOT to PSS about 1:1 in weight.

The interfacial EBL 140 includes a hole-transport polymer characterized with a hole-mobility higher than that of the electron-donating organic material in the active layer, and a small molecule that has a high hole-mobility and is capable of crosslinking on contact with air. The hole-transport polymer includes TFB, or the like, and the small molecule includes $TPDSi_2$, or the like. The ratio of $TPDSi_2$ to TFB in the EBL 140 is about 1:1 in weight. The EBL has a thickness of about 1-80 nm, preferably, about 2-30 nm. The EBL layer 140 serves to block electrons generated in the PCBM of the active layer 150 from traveling to the ITO anode 120, thereby restoring the loss in the $V_{oc}$ attributed to this leakage current. As shown below, the insertion of the EBL layer 140 can increase the $V_{oc}$ of the solar cell typically by about 100 mV.

The active organic layer 150 is formed of an electron-donating organic material and an electron-accepting organic material. The electron-donating organic material is a polymer including P3HT, MDMO-PPV, PFDTBT, PCPDTBT, PPE-PPV, or the like. The electron-accepting organic material is a fullerene derivative including PCBM, or the like. The ratio of the electron-donating organic material to the electron-accepting organic material in the active organic layer 150 is in a range of about 10:1 to 1:10 in weight. In the embodiment shown in FIG. 1, the active organic layer 150 is formed of MDMO-PPV and PCBM with a ratio of MDMO-PPV to PCBM about 1:4 by weight. The MDMO-PPV:PCBM active organic layer 150 is about 100 nm thick in the embodiment.

The solar cell can be easily fabricated according to the following steps: at first, a first solution containing PEDOT and PSS, a second solution containing TFB and $TPDSi_2$ and a third solution containing MDMO-PPV and PCBM are respectively prepared.

For the third solution preparation, a 0.34 wt. % solution of MDMO-PPV in chlorobenzene (distilled from $P_2O_5$) with PCBM present at 4 times the weight of the polymer was prepared to form a mixture. Then, the mixture is stirred for about 12-18 hours at a temperature about 50° C. in a dark environment with nitrogen to form the third solution.

Next, a substrate having an ITO coated layer is provided, and the ITO coated layer is patterned into at least two spatially separated strips to form an anode.

Sequentially, the first solution is spin-coated onto the patterned ITO anode-coated substrate to form a PEDOT:PSS layer thereon; the second solution is spin-coated onto the PEDOT:PSS layer to form a $TPDSi_2$:TFB layer thereon; and the third solution is spin-coated onto the $TPDSi_2$:TFB layer to form an active organic layer. Soon after a corresponding solution is spin-coated, the corresponding spin-coated layer is annealed at a predetermined temperature for a period of time. Additionally, the steps of spin-coating second and third solutions are performed in a nitrogen-filled glove box.

Then, a LiF layer is vapor-deposited onto the active organic layer, and an Al cathode is formed on the LiF layer.

Additionally, the solar cell may be encapsulated with a glass slide using UV-curable epoxy that is cured in a UV chamber inside the nitrogen-filled glove box.

Another aspect of the present invention provides an organic photovoltaic device having a plurality of solar cells as disclosed above. The plurality of solar cells in one embodiment are configured to be in a stack. An organic photovoltaic device may also be formed with one such solar cell.

These and other aspects of the present invention are more specifically described below.

Implementations and Examples of the Invention

Without intent to limit the scope of the invention, exemplary methods and their related results according to the embodiments of the present invention are given below. Note that titles or subtitles may be used in the examples for convenience of a reader, which in no way should limit the scope of the invention. Moreover, certain theories are proposed and disclosed herein; however, in no way they, whether they are right or wrong, should limit the scope of the invention so long as the invention is practiced according to the invention without regard for any particular theory or scheme of action.

In this exemplary example, an ITO/PEDOT:PSS/$TPDSi_2$:TFB/MDMO-PPV:PCBM/LiF/Al solar cell is fabricated and characterized according to one embodiment of the present invention. The interfacial layer of $TPDSi_2$:TFB serves to block electrons in the PCBM from traveling to the ITO anode. The layer increases the open-circuit voltage $V_{oc}$ of the device typically by about 100 mV and has produced a record-high open-circuit voltage $V_{oc}$ of 1.10 V in a system with a theoretical maximum of 1.2 V.

Figure 2:
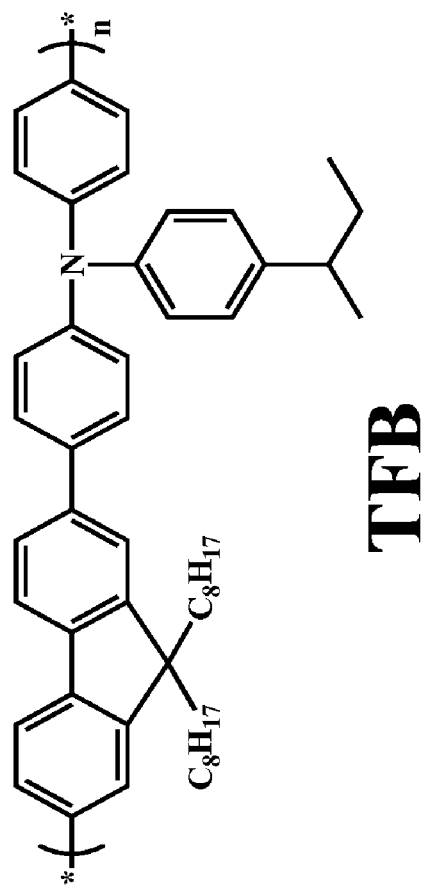
FIG. 2 shows chemical structures of TPDSi$_2$ and TFB of the EBL used in the OPV device shown in FIG. 1.
Figure 2:
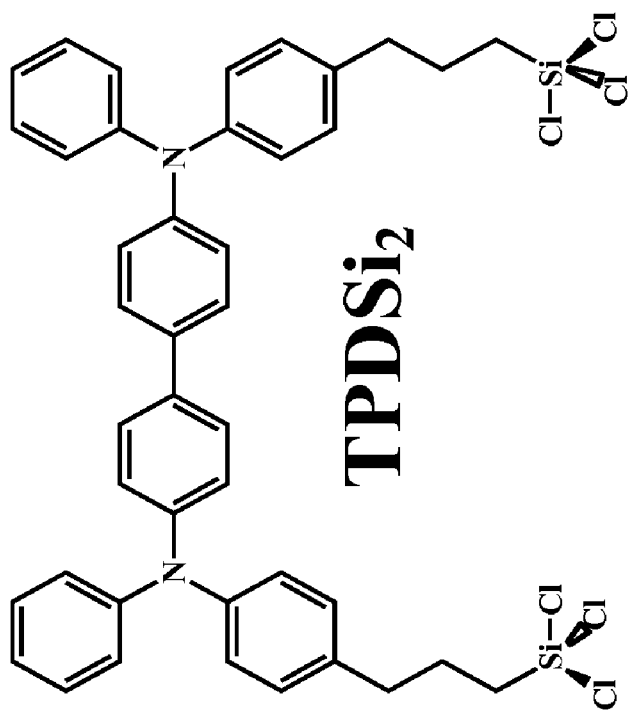

Materials: $TPDSi_2$ and TFB were synthesized according to references [16] and [17], respectively. Chemical structures of $TPDSi_2$ and TFB are shown in FIG. 2. MDMO-PPV was synthesized according to reference [18] and purified by repetitive precipitations in methanol. PCBM and P3HT were purchased from American Dye Source, Inc. (Quebec, Canada). PCBM was purified by several cycles of sonication in toluene followed by centrifugation and then sonication in pentane followed by centrifugation. P3HT was purified by soxhlet extractions with methanol and hexanes. PEDOT:PSS (Baytron P VP AI 4083) was purchased from Baytron Inc. and used as received.

Device Fabrication: An ITO anode-coated glass (15 Ω/□) was purchased from Colorado Concept Coatings, LLC (Loveland, Colo.) and cut into 3×1 inch strips. These were patterned to make two electrically separate about 3 mm strips by applying a mask and dipping in boiling concentrated HCl for 5 sec. The ITO anode was cut into 1"×0.5" substrates and cleaned by heating to 50° C. while sonicating in aqueous detergent for 30 min., DI water for 5 min., and finally hexanes, methanol, iso-propanol, and acetone, respectively for 30 min. each. The solvent-cleaned substrates were brought into a Class 1000 cleanroom where they were exposed to an oxygen plasma from an RIE (50 sccm $O_2$ flow, 150 mtorr chamber pressure, 150 W $O_2$ plasma, 2 min.) to further remove all organics from the surface. Next, about 40 nm thick films of PEDOT:PSS were immediately spin-coated onto the substrates in the cleanroom by spinning at 2800 rpm for 30 sec. Contact areas were wiped clean with acetone and a cotton swab, then the devices were annealed in a vacuum oven at 120° C. for 1 hr. A 0.34 wt. % solution of MDMO-PPV in chlorobenzene (distilled from $P_2O_5$) with PCBM present at 4 times the weight of the polymer was prepared the day before. The solution was stirred overnight in the dark at 50° C. under nitrogen and sonicated at 50° C. for 1 h the next day while the PEDOT:PSS films were annealed. The active layer solution and the substrates were next transferred to a nitrogen-filled glove box. Here the solution of $TPDSi_2$:TFB (1:1 by mass) in dry toluene was prepared from 10 mg/mL stock solutions of the components in dry toluene. The solution was diluted with toluene to a concentration of 1.67 mg $TPDSi_2$/mL and spin-coated onto the PEDOT:PSS films in the glove box at 2000 rpm for 45 sec. Contact areas were cleaned with dry toluene and a cotton swab, and the devices were exposed to air for a few minutes (about 5 min) before returning to the glove box. The EBL films were then annealed on a hot plate in the glove box at 75° C. for 1 hr. The active layer solution was then spin-coated onto the EBL or PEDOT:PSS layer at 1500 rpm for 45 sec under nitrogen. Contact areas were cleaned with dry toluene and a cotton swab, and the films were annealed on a hot plate in the glove box at 65° C. for 1 hr. In the glove box, LiF/Al (0.6 nm/80 nm) cathodes were deposited sequentially without breaking vacuum using a thermal evaporator. The rates used were 0.1 nm/s for LiF (Acros, 99.98%) and about 2 nm/s for Al (Sigma-Aldrich, 99.999%), and the pressure in the chamber was $1.1 \times 10^{-6}$ Torr. The cathodes were deposited through a shadow mask with two 2 mm strips to make 4 devices per substrate. The completed solar cells were encapsulated by placing them, covered with a UV-curable epoxy (ELC-2500, Electron-lite Corp., Bethel, Conn.) and a glass slide, in a UV chamber inside the glove box.

Device Characterization: The characterization of the BHJ solar cells was performed at room temperature using a Class A solar cell analyzer from Spectra-Nova Technologies. It contains a xenon lamp that simulates AM1.5G light from 400-1100 nm. Four-point contacts were made to the substrate.

FIG. 1 shows schematically the exemplary BHJ solar cell 100 according to one embodiment of the present invention. The BHJ solar cell 100 includes a transparent glass substrate 110, a transparent, ITO anode 120 formed on the transparent glass substrate 110, a PEDOT:PSS layer 130 formed on the ITO anode 120, an interfacial $TPDSi_2$:TFB layer 140 formed on the PEDOT:PSS layer 130, an active organic layer 150 formed of MDMO-PPV:PCBM on the interfacial $TPDSi_2$:TFB layer 140, a LiF layer 160 formed on the MDMO-PPV:PCBM layer 150, and an Al cathode 170 formed on the LiF layer 160. Then a glass substrate 180 is held on the Al cathode 170 by epoxy. The ratio of MDMO-PPV to PCBM in the active organic layer 150 is about 1:4 in weight, and the ratio of $TPDSi_2$ to TFB in the interfacial layer 140 is about 1:1 in weight.

In this exemplary embodiment, the anode ITO 120, the PEDOT:PSS layer 130, the interfacial $TPDSi_2$:TFB layer 140, the MDMO-PPV:PCBM layer 150, the LiF layer 160 and the Al cathode 170 are respectively formed to have a thickness of about 150 nm, 40 nm, 15 nm, 100 nm, 0.6 nm and 80 nm. The glass substrate 110 is about 0.7 mm thick.

Figure 3:
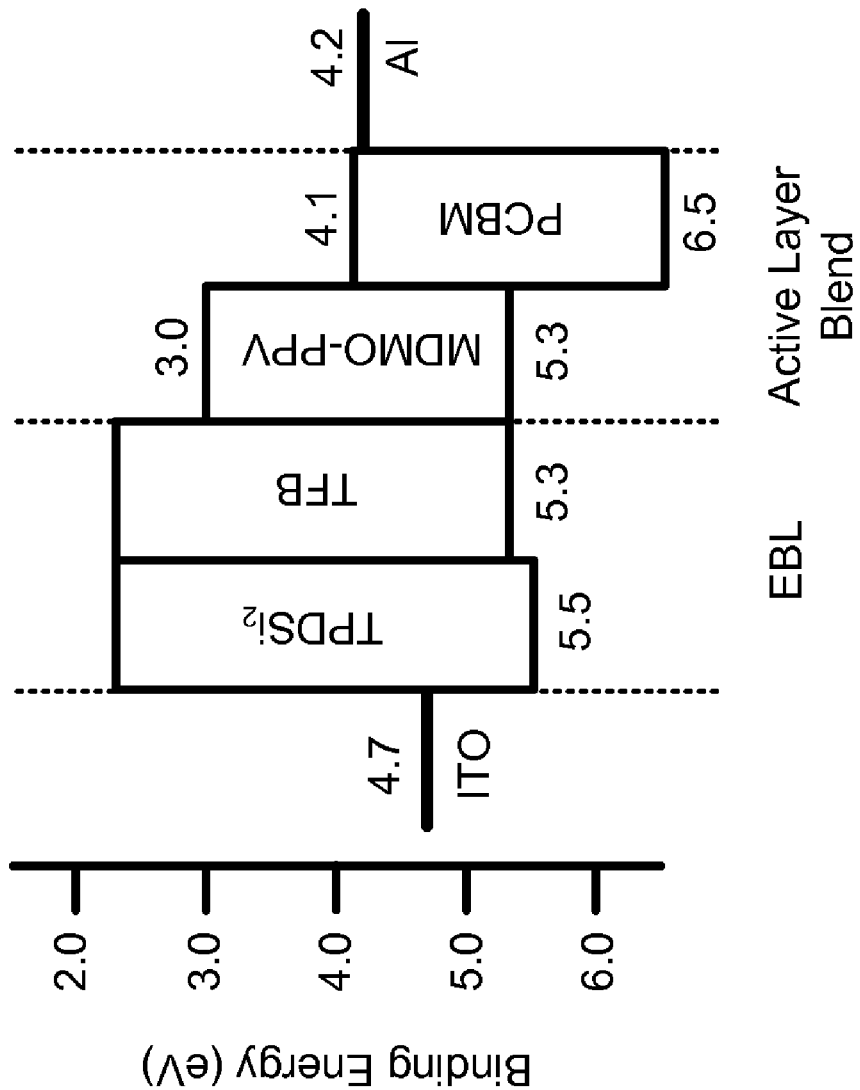
FIG. 3 shows an energy level diagram of an OPV cell with an interfacial EBL. Electrons in the LUMO of PCBM cannot transfer to the LUMO of EBL components, and are blocked from traveling to the ITO anode, hence move exclusively to the Al cathode.

FIG. 3 shows the energy levels and work functions of the materials used in the solar cell 100 shown in FIG. 1. When an exciton is split at an interface in a BHJ solar cell and the electron is transferred to the LUMO of the acceptor (PCBM) in the active layer 150, it can then transfer to the ITO anode 120 in a typical BHJ OPV. When an EBL 140 is inserted between the active layer 150 and the ITO anode 120, the LUMO levels of the components of the EBL 140 are so high that a large energetic barrier is created preventing electrons from moving from the LUMO of the acceptor in the active layer 150 to the ITO anode 120. This will force the electrons to flow in the correct direction for collection at the Al cathode 170. Electrons in the LUMO of PCBM of the active layer 150 cannot transfer to the LUMO of EBL components, and are blocked from traveling to the ITO anode 120, thereby, moving exclusively to the Al cathode 170.

Figure 6:
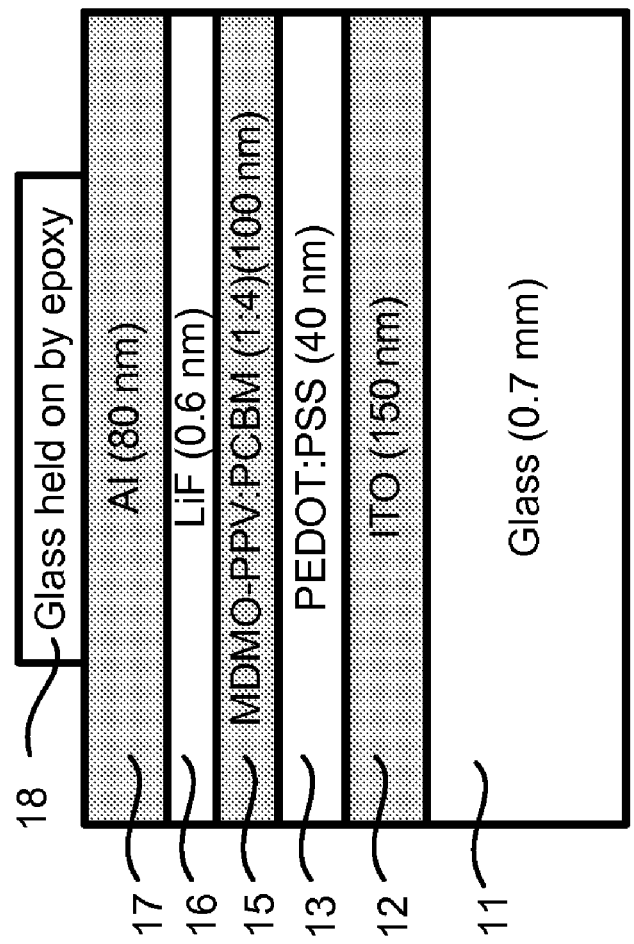
FIG. 6 shows schematically a conventional OPV cell as a control OPV cell.

As a comparison, the device architecture for a control solar cell 10 of literature design and materials [14] is shown in FIG. 6, where the solar cell 10 includes an ITO anode 12 formed on a glass substrate 11, a PEDOT:PSS layer 13 formed on the ITO anode 12, an active layer 15 of MDMO-PPV:PCBM formed on the PEDOT:PSS layer 13, a LiF layer 16 formed on the active layer 15, and an Al cathode 17 formed on the LiF layer 16. Then a glass substrate 18 is held on the Al cathode 17 by epoxy. For such a BHJ ITO/PEDOT:PSS/MDMO-PPV:PCBM/LiF/Al solar cell, the open-circuit voltage $V_{oc}$=0.82 V, short-circuit current $J_{sc}$=5.25 mA/cm$^2$, fill factor (FF)=61%, and $\eta_p$=2.5% [14].

Figure 4:
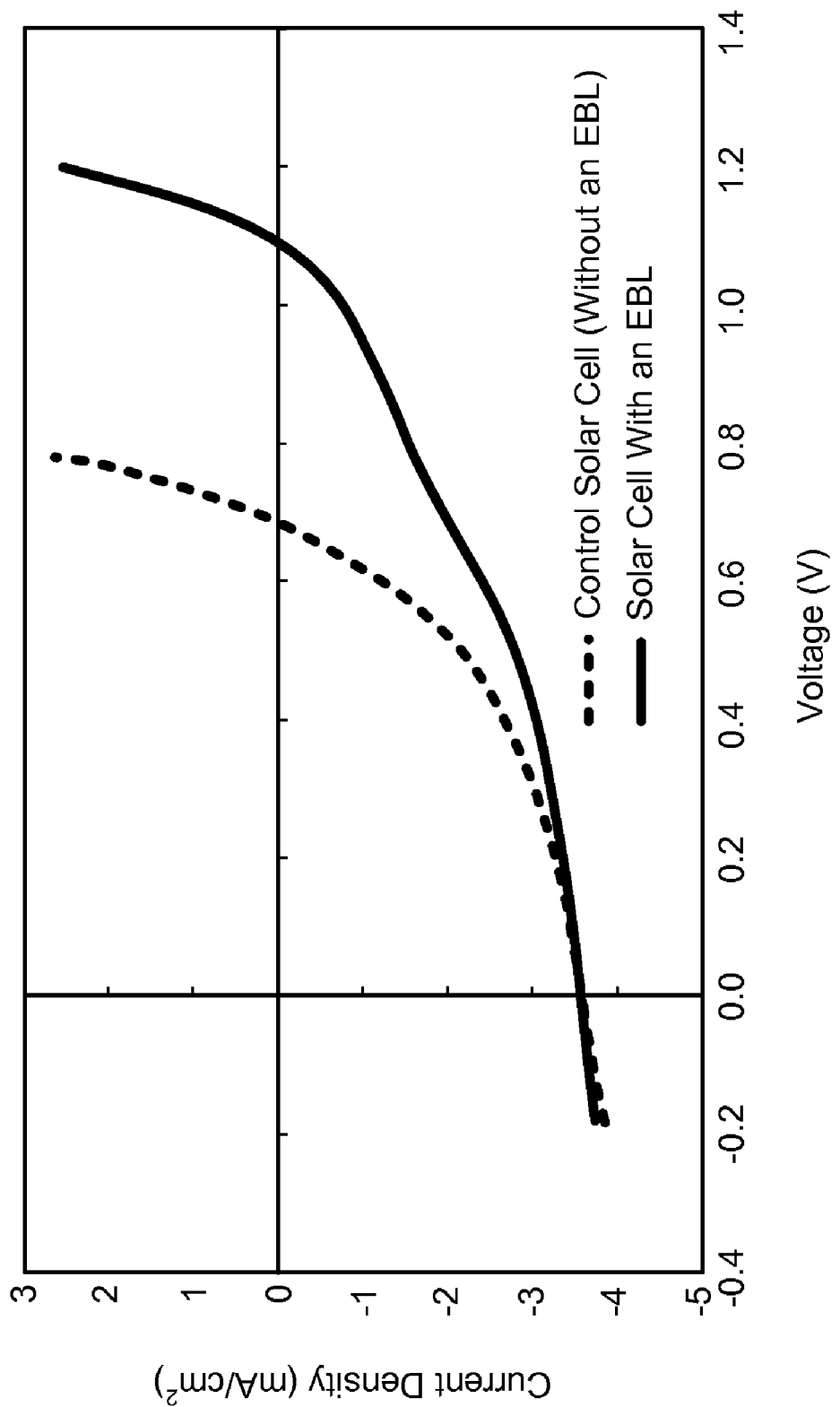
FIG. 4 shows J-V curves of a control OPV cell vs. the invented OPV cell having an EBL. The invented OPV cell has a slightly lower J$_{sc}$, but a higher V$_{oc}$ and η$_p$, compared to that of control OPV cell.

Throughout optimization of the control device, the device performance parameters have continued to improve. Regardless of the absolute values for the $V_{oc}$, $J_{sc}$, or $\eta_p$ obtained, the devices modified with the EBL exhibit consistent effects on these parameters. The $J_{sc}$ of the devices with the EBL decreases because an extra layer and interface add to the series resistance ($R_s$) of the cell. The effect of this increase in $R_s$ is dependent upon the thickness of the EBL used. The thicker the EBL, the greater the resistance and the lower the current flow through the device. In opposition to this negative effect on the cell's $J_{sc}$ caused by the addition of the EBL is the observed increase in the $V_{oc}$. The increase in the $V_{oc}$ demonstrates that the EBL is having the desired effect on electron flow through the device. Since the effect of the EBL on the $J_{sc}$ and the $V_{oc}$ oppose each other, the net effect of the EBL on $\eta_p$ depends on which is greater. While initial applications of this EBL often yield a slight decrease in $\eta_p$ due to the decrease of the $J_{sc}$ being larger than the increase of the $V_{oc}$, recently more optimized conditions have led to smaller decreases of $J_{sc}$ and larger increases in $V_{oc}$. These recent changes in $J_{sc}$ and $V_{oc}$ give a net positive result in performance, meaning that the solar cell that includes the EBL modification has a higher overall power conversion efficiency than the control device. The J-V curves of the best results to date are shown in FIG. 4. A control MDMO-PPV:PCBM solar cell with $J_{sc}$=3.58 mA/cm$^2$, $V_{oc}$=0.68 V, and $\eta_p$=1.1% are compared to a device made at the same time modified with an EBL that has $J_{sc}$=3.55 mA/cm$^2$, $V_{oc}$=1.10 V, and $\eta_p$=1.4%. This is a 30% increase in $\eta_p$ upon modification of the solar cell with the EBL. The $V_{oc}$ of 1.10 V is the highest recorded $V_{oc}$ for this OPV materials system. The device modified with an EBL has a slightly lower $J_{sc}$, but a higher $V_{oc}$ and $\eta_p$.

Furthermore, the $V_{oc}$ of a P3HT:PCBM solar cell also achieved the highest recorded value for that system when the EBL was added to the device architecture, increasing $V_{oc}$ from 0.62 V to 0.74 V.

Additional evidence that the EBL is functioning to block electron flow to the anode is obtained through intensity-modulated photocurrent spectroscopy and intensity-modulated photovoltage spectroscopy (IMPS and IMVS, respectively). These experiments apply a constant amperage to blue incident LEDs to shine light of a constant intensity that approximates that of the sun onto a solar cell. Then a small sinusoidal current (about 10% of the constant current) is applied to the LEDs to create an overlying variation in the light intensity. This intensity modulation is applied over a range of frequencies, and the solar cell's response to the intensity modulation is monitored. There is a lag between the modulation of the light intensity and the solar cell's response to that modulation. At some point, the dynamics of the solar cell cannot keep up with the modulation of the light intensity, and either the average charge transit time, $\tau_d$, or charge carrier lifetime (time until recombination), $\tau_n$, are found depending if the cell is monitored under short circuit (using IMPS) or open circuit (using IMVS) conditions, respectively.

Figure 5:
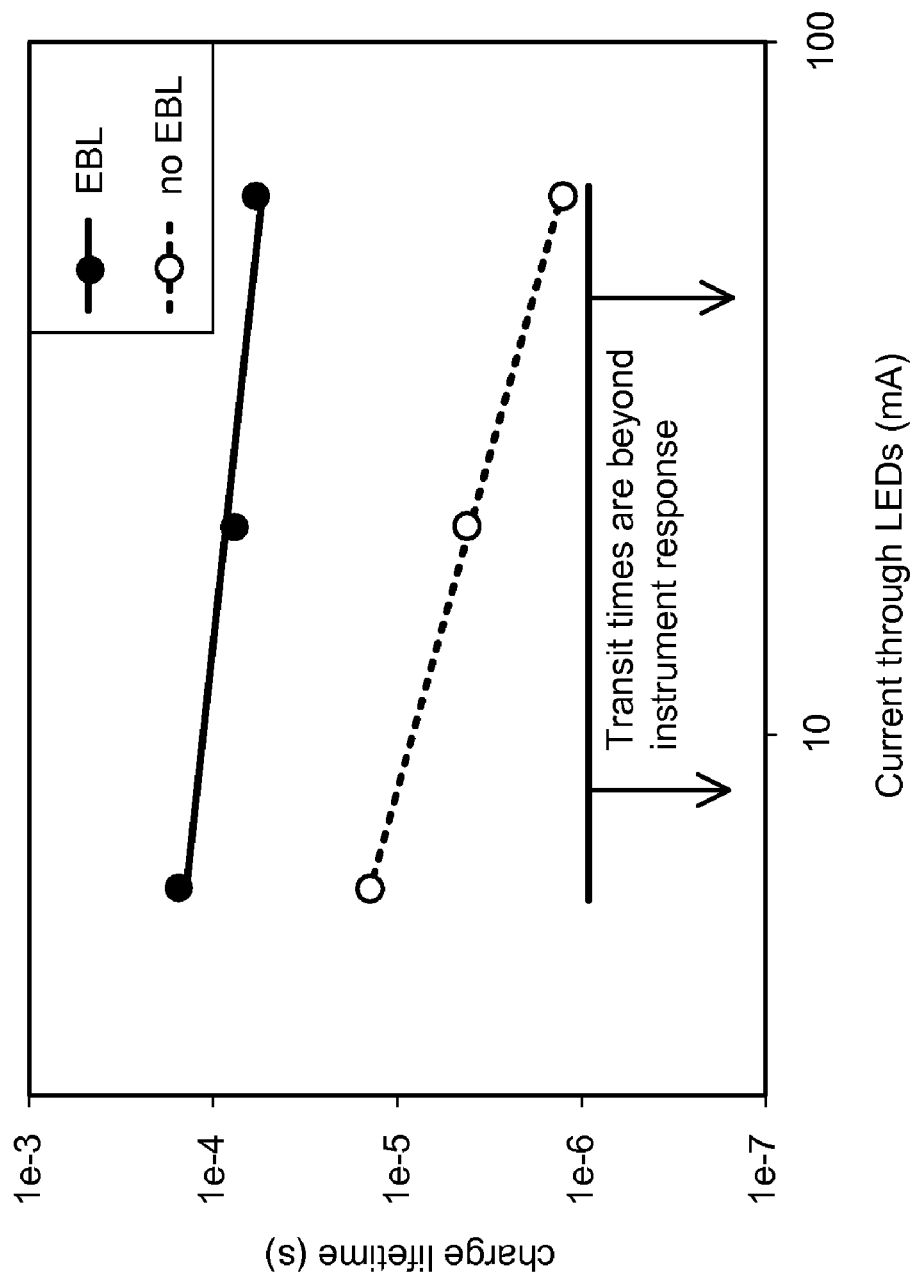
FIG. 5 shows a plot of average charge carrier lifetime versus current put through LEDs used for illumination. Lower current gives lower light intensity, which slows down dynamics of cell. At all intensities of light, charges live longer and recombine slower in solar cell with an EBL than that in the control cell.

Solar cells with and without the EBL were tested with IMPS and IMVS. Lowering the intensity of the light used in these experiments slows both the $\tau_d$ and $\tau_n$ in the solar cell. FIG. 5 shows that even at low light intensity, the charge transit times of solar cells with and without the EBL are faster than instrument response (less than $10^{-6}$ s). The charge carrier lifetimes, however, are observable. FIG. 5 shows that the recombination time of charge carriers in cells with the EBL is slowed, allowing the charges to live longer. Since the charge carriers continue to move quickly through the cell ($\tau_d < 10^{-6}$) while recombining at a slower rate, the chance that they will be collected at the proper electrode increases. This result is in perfect agreement with the previous discussion regarding electrons not being collected at (or recombining in) the anode.

The present invention, among other things, discloses an OPV cell that utilizes an interfacial electron-blocking/hole-transport layer formed between the ITO anode and the active layer to enhance the solar cell performance. In such an OPV cell, the active layer is formed of the MDMO-PPV and PCBM blend or P3HT and PCBM blend. In both cases the open-circuit voltage of the OPV cell increases dramatically when the EBL is inserted into to the cell architecture, creating record-high $V_{oc}$ values for each of these cells. The overall power conversion efficiency of the MDMO-PPV:PCBM cell with the EBL is 30% greater than a control device with no EBL.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

LIST OF REFERENCES

[1]. Brabec, C. J.; Hauch, J. A.; Schilinsky, P.; Waldauf, C. *MRS Bull.* 2005, 30, 50.

[2]. Tang, C. W. *Appl. Phys. Lett.* 1986, 48, 183.

[3]. Yu, G.; Gao, J.; Hummelen, J. C.; Wudl, F.; Heeger, A. J. *Science* 1995, 270, 1789.

[4]. Halls, J. J. M.; Walsh, C. A.; Greenham, N. C.; Marseglia, E. A.; Friend, R. H.; Moratti, S. C.; Holmes, A. B. *Nature* 1995, 376, 498.

[5]. Padinger, F.; Rittberger, R. S.; Sariciftci, N. S. *Adv. Funct. Mater.* 2003, 13, 85.

[6]. Scharber, M. C.; Mühlbacher, D.; Koppe, M.; Denk, P.; Waldauf, C.; Heeger, A. J.; Brabec, C. J. *Adv. Mater.* 2006, 18, 789.

[7]. Li, G.; Shrotriya, V.; Huang, J.; Yao, Y.; Moriarty, T.; Emery, K.; Yang, Y. *Nat. Mater.* 2005, 4, 864.

[8]. Ma, W.; Yang, C.; Gong, X.; Kwanghee, L.; Heeger, A. *Adv. Funct. Mater.* 2005, 15, 1617.

[9]. Ramsdale, C. M.; Barker, J. A.; Arias, A. C.; MacKenzie, J. D.; Friend, R. H.; Greenham, N. C. *J. Appl. Phys.* 2002, 92, 4266.

[10]. Frohne, H.; Shaheen, S. E.; Brabec, C. J.; Müller, D. C.; Sariciftci, N. S.; Meerholz, K. *ChemPhysChem* 2002, 3, 795.

[11]. Brabec, C. J.; Sariciftci, N. S.; Hummelen, J. C. *Adv. Funct. Mater.* 2001, 11, 15.

[12]. Brabec, C. J.; Shaheen, S. E.; Winder, C.; Sariciftci, N. S. *Appl. Phys. Lett.* 2002, 80.

[13]. Gledhill, S. E.; Scott, B.; Gregg, B. A. *J. Mater. Res.* 2005, 20, 3167.

[14]. Shaheen, S. E.; Brabec, C. J.; Sariciftci, N. S. *Appl. Phys. Lett.* 2001, 78, 841.

[15]. Yan, H.; Marks, T. J. *Proc. SPIE-Int. Soc. Opt. Eng.* 2004, 5519, 270.

[16]. Huang, Q.; Evmenenko, G. A.; Dutta, P.; Lee, P.; Armstrong, N. R.; Marks, T. J. *J. Am. Chem. Soc.* 2005, 127, 10227.

[17]. Yan, H.; Lee, P.; Armstrong, N. R.; Graham, A.; Evmenenko, G. A.; Dutta, P.; Marks, T. J. *J. Am. Chem. Soc.* 2005, 127, 3172.

[18]. Mozer, A. J.; Denk, P.; Scharber, M. C.; Neugebauer, H.; Sariciftci, N. S. *J. Phys. Chem. B* 2004, 108, 5235.

What is claimed is:

1. An organic photovoltaic device, comprising:
   one or more solar cells, each solar cell comprising:
   a. a transparent substrate;
   b. a tin-doped indium oxide (ITO anode) or other transparent conducting anode formed on the transparent substrate;
   c. a semiconducting layer formed on the ITO anode, the semiconducting layer comprising poly(3,4-ethylenedioxythiophene) (PEDOT) and poly(styrenesulfonate) (PSS);
   d. an electron-blocking layer (EBL) formed on the semiconducting layer, the EBL comprising a polymer poly (9,9-dioctylfluorene-co-N-(4-(3-methylpropyl)) diphenylamine) (TFB) and a small molecule 4,4'-bis[(p-trichlorosilylpropylphenyl) phenylamino]biphenyl ($TPDSi_2$);
   e. an active organic layer formed on the EBL, the active organic layer comprising poly(2-methoxy-5-(3',7'-dimethyl-octyloxy))-p-phenylene vinylene (MDMO-PPV) and [6,6]-phenyl-$C_{61}$ butyric acid methyl ester (PCBM);
   f. a lithium fluoride (LiF) layer formed on the active organic layer; and
   g. a metallic cathode formed on the LiF layer, the metallic cathode comprising an aluminum (Al) cathode.

2. The organic photovoltaic device of claim 1, wherein the EBL has a thickness of about 1-80 nm, preferably, about 2-30 nm.

3. The organic photovoltaic device of claim 1, wherein the ratio of $TPDSi_2$ to TFB in the EBL is about 1:1 in weight.

4. A solar cell, comprising:
   a. an anode;
   b. an active organic layer comprising an electron-donating organic material and an electron-accepting organic material;
   c. a semiconducting layer formed between the anode and the active organic layer; and
   d. an electron-blocking layer (EBL) formed between the semiconducting layer and the active organic layer, wherein the EBL is transparent and adapted for blocking electron leakage from the active organic layer to the anode while transporting holes from the active organic layer to the anode, wherein the EBL comprises a hole-transport polymer characterized with a hole-mobility higher than that of the electron-donating organic material in the active layer, and a small molecule that has a high hole-mobility and is capable of crosslinking on contact with air, wherein the hole-transport polymer comprises poly(9,9-dioctylfluorene-co-N-(4-(3-methylpropyl))diphenylamine) (TFB), and wherein the small molecule comprises 4,4'-bis[(p-trichlorosilylpropylphenyl)phenylamino]biphenyl ($TPDSi_2$).

5. The solar cell of claim 4, further comprising:
   a. a lithium fluoride (LiF) layer formed on the active organic layer; and
   b. a cathode formed on the LiF layer.

6. The solar cell of claim 5, wherein the cathode is formed of a metal, wherein the metal comprises aluminum (Al), titanium (Ti), tungsten (W), silver (Ag), gold (Au) or an alloy thereof.

7. The solar cell of claim 4, wherein the anode is transparent and formed of tin-doped indium oxide (ITO anode).

8. The solar cell of claim 4, wherein the semiconducting layer comprises poly(3,4-ethylenedioxythiophene) (PEDOT) and poly(styrenesulfonate) (PSS).

9. The solar cell of claim 4, wherein the ratio of $TPDSi_2$ to TFB in the EBL is about 1:1 in weight.

10. The solar cell of claim 4, wherein the EBL has a thickness of about 1-80 nm, preferably, about 2-30 nm.

11. The solar cell of claim 4, wherein the electron-donating organic material comprises poly(3-hexylthiophene) (P3HT), poly(2-methoxy-5-(3',7'-dimethyl-octyloxy))-p-phenylene vinylene (MDMO-PPV), poly(2,7-(9-(2'-ethylhexyl)-9-hexyl-fluorene)-alt-5,5-(4',7'-di-2-thienyl-2',1',3'-benzothiadiazole)) (PFDTBT), poly(2,6-(4,4-bis-(2-ethylhexyl)-4H-cyclopenta(2,1-b;3,4-6')dithiophene)-alt-4,7-(2,1,3-benzothiadiazole)) (PCPDTBT), or poly(p-phenylene-ethynylene)-alt-poly(p-phenylene-vinylene) (PPE-PPV), and wherein the electron-accepting organic material comprises [6,6]-phenyl-$C_{61}$ butyric acid methyl ester (PCBM).

12. An organic photovoltaic device comprising one or more solar cells of claim 4, wherein the more solar cells are configured to be in a stack.

13. A method of fabricating a solar cell, comprising the steps of:
   a. preparing a first solution containing poly(3,4-ethylenedioxythiophene) (PEDOT) and poly(styrenesulfonate) (PSS);
   b. preparing a second solution containing poly(9,9-dioctylfluorene-co-N-(4-(3-methylpropyl))diphenylamine) (TFB) and 4,4'-bis[(p-trichlorosilylpropylphenyl) phenylamino]biphenyl ($TPDSi_2$);
   c. preparing a third solution containing poly(2-methoxy-5-(3',7'-dimethyl-octyloxy))-p-phenylene vinylene (MDMO-PPV) and [6,6]-phenyl-$C_{61}$ butyric acid methyl ester (PCBM);
   d. providing a substrate having a tin-doped indium oxide (ITO anode) coated layer;
   e. patterning the ITO anode coated layer into at least two spatially separated strips to form an anode;
   f. spin-coating the first solution onto the patterned ITO anode-coated substrate to form a PEDOT:PSS layer thereon;
   g. spin-coating the second solution onto the PEDOT:PSS layer to form a $TPDSi_2$:TFB layer thereon;
   h. spin-coating the second solution onto the $TPDSi_2$:TFB layer to form an active organic layer;
   i. vapor-depositing lithium fluoride (LiF) onto the active organic layer; and
   j. forming a metallic cathode on the LiF layer.

14. The method of claim 13, wherein the step of preparing the third solution comprises the steps of:
   ci. mixing the amount of MDMO-PPV and the amount of PCBM in chlorobenzene to form a mixture; and
   cii. stirring the mixture for about 12-20 hours at a temperature about 50° C. in a dark environment with nitrogen to form the third solution.

15. The method of claim 13, wherein each of spin-coating steps (f)-(h) further comprises the step of annealing the corresponding spin-coated layer.

16. The method of claim 15, wherein spin-coating steps (g) and (h) are performed in a nitrogen-filled glove box.

17. The method of claim 13, wherein the step of forming a metallic cathode on the LiF layer comprises a step of forming an aluminum (Al) cathode on the LiF layer.

18. A method of fabricating a solar cell, comprising the steps of:
   a. forming an anode on a transparent substrate;
   b. forming a semiconducting layer formed on the anode;
   c. forming an EBL on the semiconducting layer; and
   d. forming an active organic layer formed on the EBL, wherein the active organic layer comprises an electron-donating organic material and an electron-accepting organic material,
   wherein the EBL is formed such that it is transparent and adapted for blocking electron leakage from the active organic layer to the anode while transporting holes from the active organic layer to the anode, wherein the EBL comprises a hole-transport polymer characterized with a hole-mobility higher than that of the electron-donating organic material in the active layer, and a small molecule that has a high hole-mobility and is capable of crosslinking on contact with air, wherein the hole-transport polymer comprises poly(9,9-dioctylfluorene-co-N-(4-(3-methylpropyl))diphenylamine) (TFB), and wherein the small molecule comprises 4,4'-bis[(p- trichlorosilylpropylphenyl)phenylamino]biphenyl ($TPDSi_2$).

19. The method of claim 18, further comprising the steps of:
   a. forming a lithium fluoride (LiF) layer on the active organic layer; and
   b. forming a cathode on the LiF layer.

20. The method of claim 18, wherein the anode is transparent and formed of tin-doped indium oxide (ITO anode).

21. The method of claim 18, wherein the semiconducting layer comprises poly(3,4-ethylenedioxythiophene) (PEDOT) and poly(styrenesulfonate) (PSS).

22. The method of claim 18, wherein the ratio of $TPDSi_2$ to TFB in the EBL is about 1:1 in weight.

23. The method of claim 18, wherein the electron-donating organic material comprises poly(3-hexylthiophene) (P3HT), poly(2-methoxy-5-(3',7'-dimethyl-octyloxy))-p-phenylene vinylene (MDMO-PPV), poly(2,7-(9-(2'-ethylhexyl)-9-hexyl-fluorene)-alt-5,5-(4',7'-di-2-thienyl -2',1',3'-benzothiadiazole)) (PFDTBT), poly(2,6-(4,4-bis-(2-ethylhexyl)-4H-cyclopenta(2,1-b;3,4-6')dithiophene)-alt-4,7-(2,1,3-benzothiadiazole)) (PCPDTBT), or poly(p-phenylene-ethynylene)-alt-poly(p-phenylene-vinylene) (PPE-PPV), and wherein the electron-accepting organic material comprises [6,6]-phenyl-$C_{61}$ butyric acid methyl ester (PCBM).

24. A method for forming a solar cell device with a plurality of solar cells in a stack, wherein each of the plurality of solar cells is formed by the method of claim 18.

* * * * *